(12) United States Patent
Sarpatwari et al.

(10) Patent No.: US 11,942,139 B2
(45) Date of Patent: *Mar. 26, 2024

(54) PERFORMING REFRESH OPERATIONS ON MEMORY CELLS

(71) Applicant: Micron Technology, Inc., Boise, ID (US)

(72) Inventors: Karthik Sarpatwari, Boise, ID (US); Lingming Yang, Meridian, ID (US); Nevil N. Gajera, Meridian, ID (US); John Christopher M. Sancon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,570

(22) Filed: Dec. 6, 2022

(65) Prior Publication Data

US 2023/0102468 A1 Mar. 30, 2023

Related U.S. Application Data (63) Continuation of application No. 17/167,922, filed on Feb. 4, 2021, now Pat. No. 11,532,347.

(51) Int. Cl.
  *G11C 11/406* (2006.01)
  *G11C 11/4074* (2006.01)
  *G11C 11/4091* (2006.01)

(52) U.S. Cl.
  CPC .. *G11C 11/40622* (2013.01); *G11C 11/40615* (2013.01); *G11C 11/4074* (2013.01); *G11C 11/4091* (2013.01)

(58) Field of Classification Search
  CPC ............ G11C 13/0004; G11C 13/0002; G11C 13/0021; G11C 13/0033; G11C 13/004
  See application file for complete search history.

(56) References Cited

U.S. PATENT DOCUMENTS

| | | |
|---|---|---|
| 9,275,730 B2 | 3/2016 | Tortorelli et al. |
| 10,424,376 B2 | 9/2019 | Pirovano |
| 10,777,275 B2 * | 9/2020 | Pirovano ............. H01L 27/2463 |
| 11,217,308 B1 * | 1/2022 | Robustelli .......... G11C 13/0069 |
| 2008/0025079 A1 | 1/2008 | Philipp et al. |
| 2010/0321987 A1 * | 12/2010 | Lung .................. G11C 13/0069 365/207 |

(Continued)

*Primary Examiner* — Mushfique Siddique
(74) *Attorney, Agent, or Firm* — Brooks, Cameron & Huebsch, PLLC (57) ABSTRACT

The present disclosure includes apparatuses, methods, and systems for performing refresh operations on memory cells. An embodiment includes a memory having a group of memory cells and one or more additional memory cells whose data state is indicative of whether to refresh the group of memory cells, and circuitry configured to apply a first voltage pulse to the group of memory cells to sense a data state of the memory cells of the group, apply, while the first voltage pulse is applied to the group of memory cells, a second voltage pulse having a greater magnitude than the first voltage pulse to the one or more additional memory cells to sense a data state of the one or more additional memory cells, and determine whether to perform a refresh operation on the group of memory cells based on the sensed data state of the one or more additional memory cells.

20 Claims, 6 Drawing Sheets

(56) References Cited

U.S. PATENT DOCUMENTS

| | | |
|---|---|---|
| 2012/0063196 A1 | 3/2012 | Kim et al. |
| 2013/0336048 A1* | 12/2013 | Hokenmaier ........ G11C 13/004 |
| | | 365/163 |
| 2015/0098264 A1* | 4/2015 | Park .................. G11C 13/0069 |
| | | 365/148 |
| 2019/0043580 A1 | 2/2019 | Pirovano et al. |
| 2019/0198105 A1* | 6/2019 | Pirovano ............ G11C 13/0004 |
| 2019/0206491 A1* | 7/2019 | Banerjee ............... G06F 3/0673 |
| 2022/0068377 A1* | 3/2022 | Lu ....................... G11C 13/004 |
| 2022/0068383 A1* | 3/2022 | Giduturi ............ G11C 13/0069 |

* cited by examiner

*FIG. 5*

PERFORMING REFRESH OPERATIONS ON MEMORY CELLS

PRIORITY INFORMATION

This application is a Continuation of U.S. application Ser. No. 17/167,922 filed Feb. 4, 2021, the contents of which are included herein by reference.

TECHNICAL FIELD

The present disclosure relates generally to semiconductor memory and methods, and more particularly, to performing refresh operations on memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

The present disclosure includes apparatuses, methods, and systems for performing refresh operations on memory cells. An embodiment includes a memory having a group of memory cells and one or more additional memory cells whose data state is indicative of whether to refresh the group of memory cells, and circuitry configured to apply a first voltage pulse to the group of memory cells to sense a data state of the memory cells of the group, apply, while the first voltage pulse is applied to the group of memory cells, a second voltage pulse having a greater magnitude than the first voltage pulse to the one or more additional memory cells to sense a data state of the one or more additional memory cells, and determine whether to perform a refresh operation on the group of memory cells based on the sensed data state of the one or more additional memory cells.

During the sensing of a resistance variable memory cell, such as a self-selecting memory cell, a voltage may be applied to the memory cell, and the data state of the cell can be determined based on the amount of current that flows through the cell in response to the applied voltage. During such a sense operation, however, other (e.g., unselected) memory cells that are coupled to the same signal line as the memory cell that is being sensed may be undesirably affected by the voltage being applied to the selected memory cell being sensed. This undesirable effect on the unselected memory cells can be referred to as read disturb. A memory cell that has been significantly affected by read disturb may be sensed to be in a different data state than the state to which the cell was actually programmed, because, for instance, the read disturb may have caused the threshold voltage of the memory cell to decrease. Such erroneous data sensing due to the read disturb can reduce the performance and/or lifetime of the memory and may be more severe in memory having an increased memory cell density. Therefore, it may be beneficial to refresh those affected cells prior to the read disturb on memory cells causing erroneous sensing of the cells.

In some previous approaches, program/read cycle counters can be utilized to determine when memory cells may need to be refreshed to avoid read disturb. However, such approaches may not always provide an accurate indication of when the memory cells need to be refreshed. Further, such approaches can increase the cost and/or complexity of the memory.

Embodiments of the present disclosure, however, can determine whether to refresh memory cells prior to the cells being substantially affected by read disturb, for example, without utilizing program/read cycle counters. For example, embodiments of the present disclosure can operate additional memory cells (e.g., spare memory cells) using a sensing voltage pulse having a different (e.g., higher) magnitude than that associated with the sensing of the other memory cells (e.g., non-spare memory cells), which will deterministically make the spare memory cells fail (e.g., cause the spare memory cells to be sensed to be in a different data state than the state to which they were programmed) prior to the non-spare memory cells failing. As such, the spare memory cells failing can be a deterministic indicator to refresh the non-spare memory cells (e.g., so as to refresh the non-spare memory cells prior to the non-spare memory cells failing). As used herein, a memory cell whose data state is indicative of whether to refresh the other memory cell(s) may be referred to as a spare memory cell.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

Figure 1:
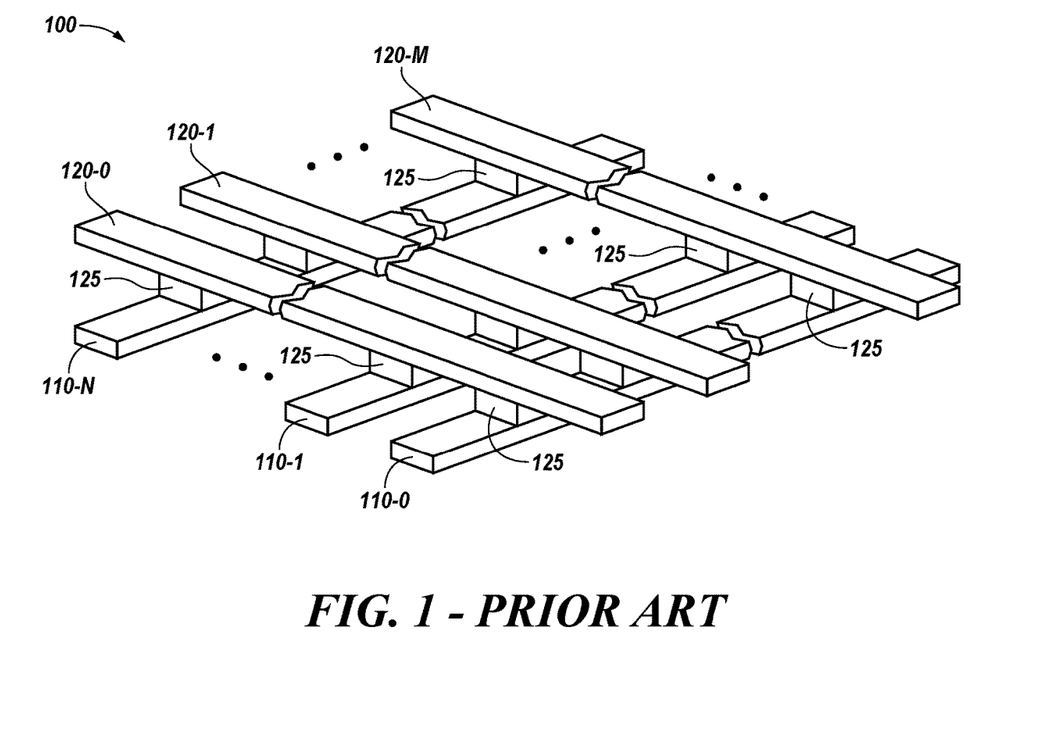
FIG. 1 is a three-dimensional view of an example of a memory array, in accordance with an embodiment of the present disclosure.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
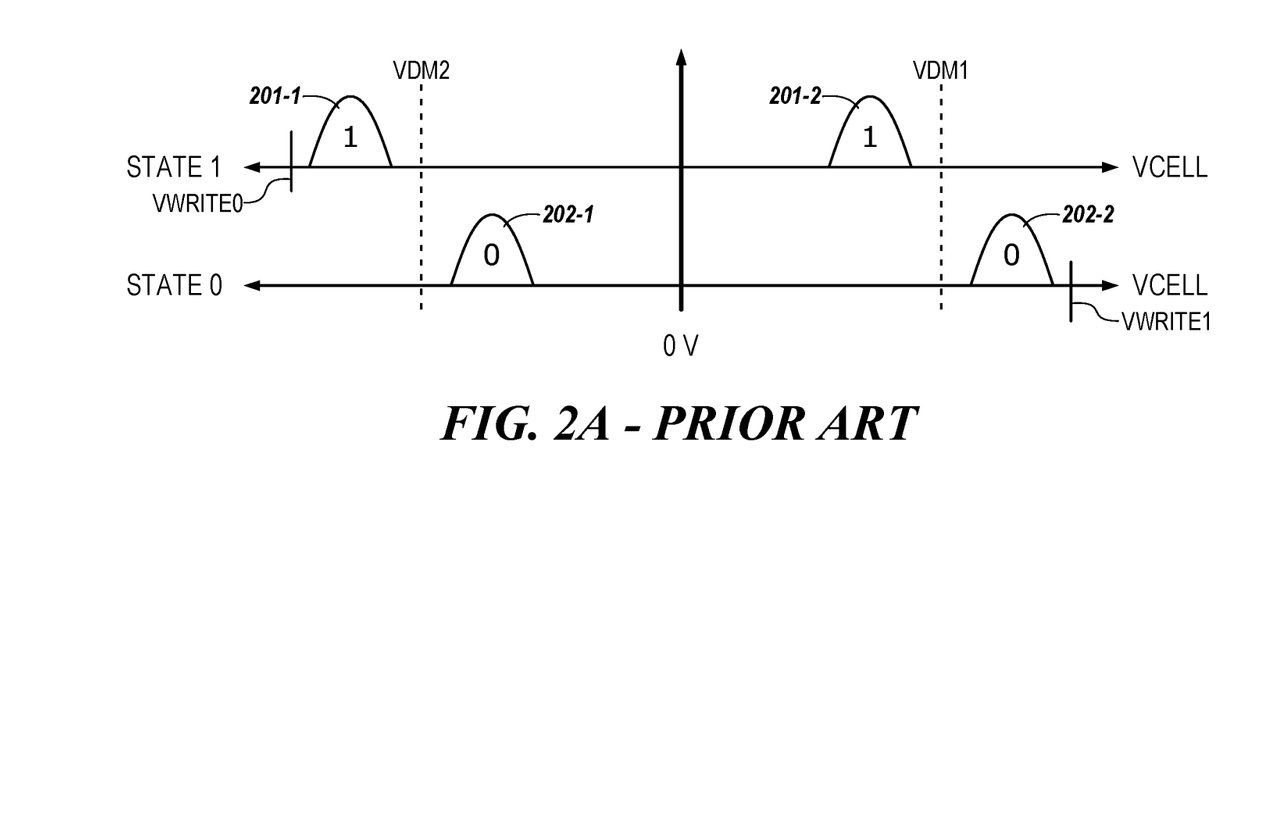
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
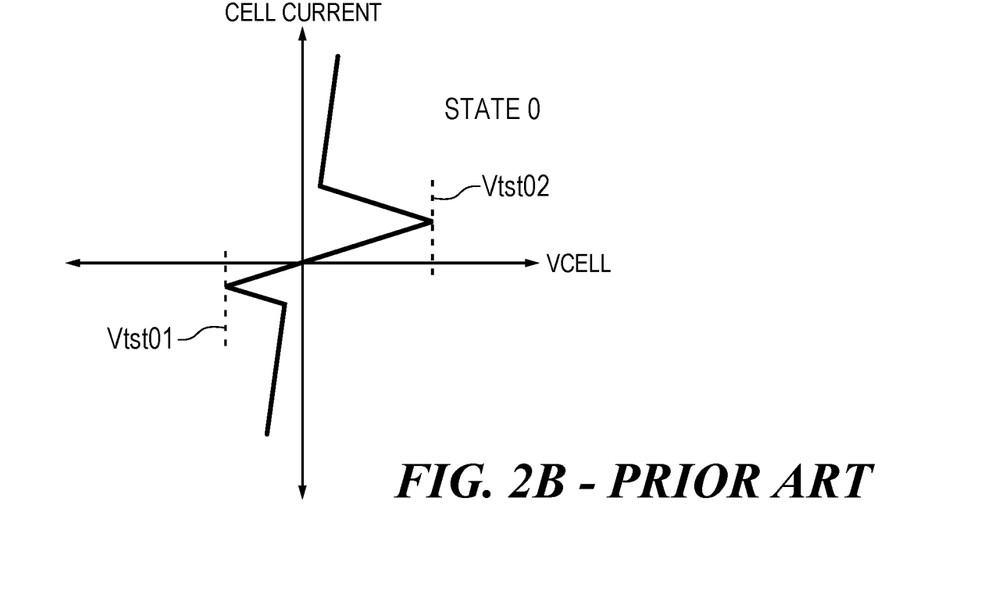
FIG. 2B is an example of a current-versus-voltage curve corresponding to a memory state of FIG. 2A, in accordance with an embodiment of the present disclosure.
Figure 2C:
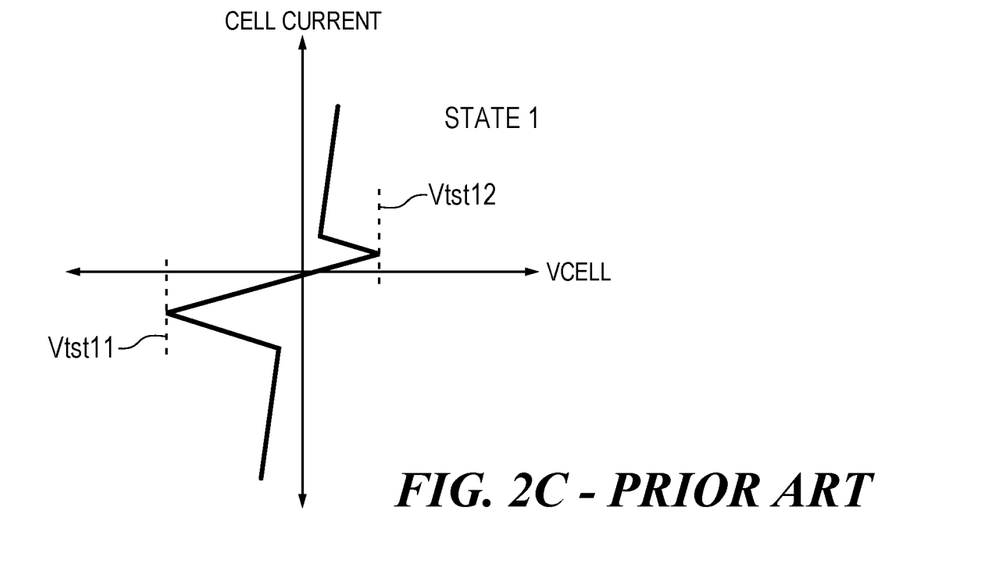
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 202-1 and 202-2) whose magnitude is greater for a positive polarity than a negative polarity, and a second data state (e.g., state 1) is associated with a second asymmetric threshold voltage distribution (e.g., threshold voltage distributions 201-1 and 201-2) whose magnitude is greater for a negative polarity than a positive polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 1 (e.g., in threshold voltage distribution 201-2) from cells in state 0 (e.g., threshold voltage distribution 202-2). Similarly, VDM2 is a negative voltage used to distinguish cells in state 0 (e.g., threshold voltage distribution 202-1) from cells in state 1 (e.g., threshold voltage distribution 201-1). In the examples of FIGS. 2A-2C, a memory cell 125 in a positive state 0 does not snap back in response to applying VDM1; a memory cell 125 in a positive state 1 snaps back in response to applying VDM1; a memory cell 125 in a negative state 0 snaps back in response to applying VDM2; and a memory cell 125 in a negative state 1 does not snap back in response to applying VDM2.

Embodiments are not limited to the example shown in FIG. 2A. For example, the designations of state 0 and state 1 can be interchanged (e.g., distributions 201-1 and 201-2 can be designated as state 0 and distributions 202-1 and 202-2 can be designated as state 1).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 0 is designated as the higher threshold voltage state in a particular polarity (positive polarity direction in this example), and in which state 1 is designated as the higher threshold voltage state in the opposite polarity (negative polarity direction in this example). As noted above, the state designation can be interchanged such that state 1 could correspond to the higher threshold voltage state in the positive polarity direction with state 0 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 0 (e.g., threshold voltage distribution 202-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 0 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 1 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 1 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 0 cell, the resulting snapback event may reduce the threshold voltage of the cell to a level below VDM1, which would result in the cell being read as state 1 (e.g., threshold voltage distribution 201-2). Similarly, if a VCELL exceeding Vtst11 is applied to a state 1 cell, the resulting snapback event may reduce the threshold voltage of the cell to a level below VDM2, which would result in the cell being read as state 0 (e.g., threshold voltage distribution 201-2). As such, in a number of embodiments, a snapback event can be used to write a cell to the opposite state (e.g., from state 0 to state 1 and vice versa).

As a selected memory cell 125 is repeatedly sensed, the magnitudes of the snapback voltages (e.g., Vtst 01, Vtst 02, Vtst11, and Vtst12) of neighboring cells (e.g., unselected memory cells coupled to a same access line as the selected cell) may decrease due to read disturb. This reduction may cause the affected memory cells to be sensed to be in a different data state than the state to which the cells were actually programmed. A conceptual example of such read disturb will be further described herein (e.g., in connection with FIG. 4). Therefore, those affected memory cells need to be refreshed prior to their data states being erroneously sensed. A VCELL that will result in a snapback event of the memory cell can be utilized for refreshing the data state of the affected memory cells. For example, the affected memory cell that was actually programmed to a reset state (but whose threshold voltage has decreased enough to be sensed as a set state) can be refreshed by applying a VCELL exceeding Vtst11. Similarly, the memory cell that was actually programmed to a set state (but whose threshold voltage has decreased enough to be sensed as a reset state) can be refreshed by applying a VCELL exceeding Vtst02.

Figure 3:
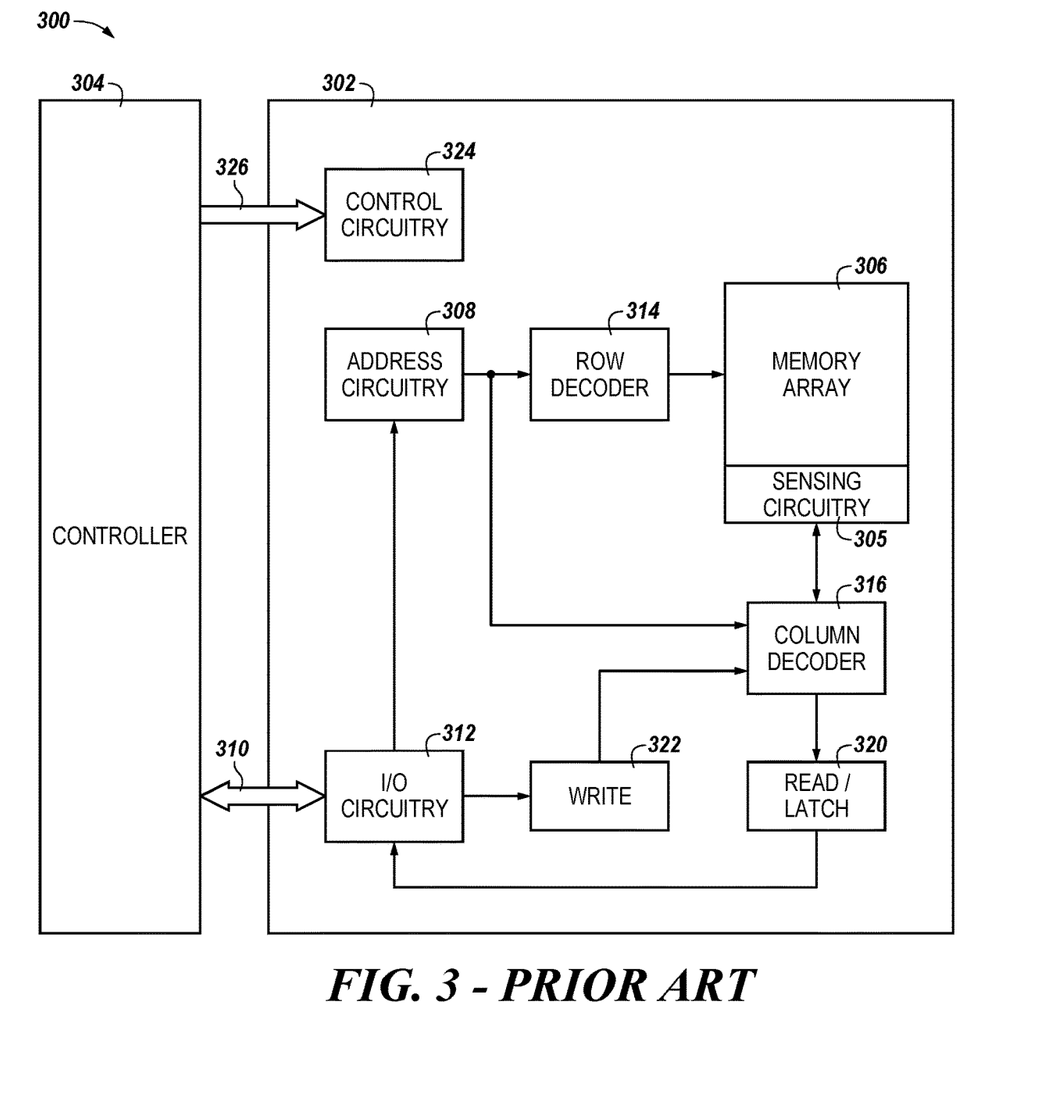
FIG. 3 is a block diagram illustration of an example apparatus, in accordance with an embodiment of the present disclosure.

FIG. 3 is a block diagram illustration of an example apparatus, such as an electronic memory system 300, in accordance with an embodiment of the present disclosure. Memory system 300 may include an apparatus, such as a memory device 302 and a controller 304, such as a memory controller (e.g., a host controller). Controller 304 might include a processor, for example. Controller 304 might be coupled to a host, for example, and may receive command signals (or commands), address signals (or addresses), and data signals (or data) from the host and may output data to the host.

Memory device 302 includes a memory array 306 of memory cells. For example, memory array 306 may include one or more of the memory arrays, such as a cross-point array, of memory cells disclosed herein. Memory device 302 may include address circuitry 308 to latch address signals provided over I/O connections 310 through I/O circuitry 312. Address signals may be received and decoded by a row decoder 314 and a column decoder 316 to access the memory array 306. For example, row decoder 314 and/or column decoder 316 may include drivers.

Memory device 302 may sense (e.g., read) data in memory array 306 by sensing voltage and/or current changes in the memory array columns using sense/buffer circuitry that in some examples may be read/latch circuitry 320. Read/latch circuitry 320 may read and latch data from the memory array 306. Sensing circuitry 305 may include a number of sense amplifiers coupled to memory cells of memory array 306, which may operate in combination with the read/latch circuitry 320 to sense (e.g., read) memory states from targeted memory cells, as will be further described herein. I/O circuitry 312 may be included for bi-directional data communication over the I/O connections 310 with controller 304. Write circuitry 322 may be included to write data to memory array 306.

Control circuitry 324 may decode signals provided by control connections 326 from controller 304. These signals may include chip signals, write enable signals, and address latch signals that are used to control the operations on memory array 306, including data read and data write operations.

Control circuitry 324 may be included in controller 304, for example. Controller 304 may include other circuitry, firmware, software, or the like, whether alone or in combination. Controller 304 may be an external controller (e.g., in a separate die from the memory array 306, whether wholly or in part) or an internal controller (e.g., included in a same die as the memory array 306). For example, an internal controller might be a state machine or a memory sequencer.

In some examples, the controller 304 may be configured to operate memory cells of the memory array 306 using voltage pulses having different magnitudes. For example, the controller 304 can operate spare memory cells of the array 306 by applying (when sensing the data state of the spare memory cells) a voltage pulse having a greater magnitude than a voltage pulse being applied to non-spare memory cells to sense the data state of those cells, which can result in the spare memory cells failing before the non-spare memory cells. Therefore, the failure of the spare memory cells can be used as an indication of whether to refresh the non-spare memory cells. That is, a determination of whether to perform a refresh operation on the non-spare memory cells can be made based on the sensed data state of the spare memory cells (e.g., based on whether the sensed data state of the spare memory cells is erroneous). For example, if the sensed data state of the spare memory cells is different than a predetermined data state (e.g., the data state that the spare memory cells were actually programmed to), the controller 304 can perform a refresh operation on the non-spare memory cells, which can readjust the threshold voltages of the non-spare memory cells before sensing of the non-spare memory cells fails. The voltage pulses used to sense the spare memory cells and the non-spare memory cells can have a same polarity, although embodiments are not so limited. Further, for example, the controller can prevent a refresh operation form being performed on the non-spare memory cells in response to the sensed data state of the one or more spare memory cells not being different from a particular data state (e.g., predetermined data state).

In some examples, the spare memory cells can be coupled to additional capacitors, such as boosting capacitors (not shown in FIG. 3), which can be used to increase (e.g., amplify) the magnitude of the voltage pulse used for sensing the spare memory cells. For example, the boosting capacitors can increase the magnitude from that of VDM 542 illustrated in connection with FIG. 5 to that of VDM, SPARE 544 illustrated in connection with FIG. 5.

Figure 4:
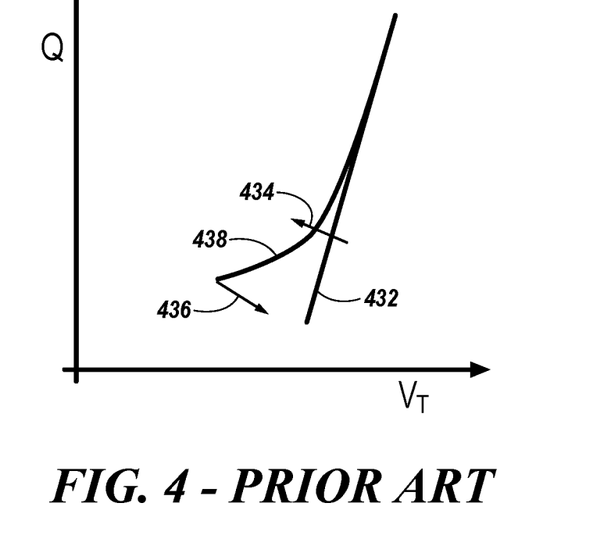
FIG. 4 illustrates a conceptual example of read disturb that a memory cell may experience over time, in accordance with an embodiment of the present disclosure.

FIG. 4 illustrates a conceptual example of read disturb that a memory cell may experience over time, in accordance with an embodiment of the present disclosure. Although embodiments are not so limited, the threshold voltage distribution 432 illustrated in FIG. 4 can be, for instance, the threshold voltage distribution 202-2 (e.g., state 0) previously described in connection with FIG. 2A.

The read disturb on memory cells can undesirably shift the threshold voltage distribution 432 of the cells. For example, the threshold voltage distribution 432 of the cells can undesirably shift (e.g., in a direction indicated by an arrow 434) to a threshold voltage distribution 438, which can generate a tail as illustrated in FIG. 4. The tail may extend beyond a magnitude of a demarcation voltage (e.g., VDM1 and/or VDM2 previously described in connection with FIG. 2A), which can result in an erroneous determination of the data state (e.g., logical state) of the cells. For instance, in an example where the threshold voltage distribution 432 represents a reset state (e.g., state 0), the memory cells with the threshold voltage distribution 432 can be erroneously determined to be a set state (e.g., state 1) when their distributions have shifted to distribution 438 as illustrated in FIG. 4. Therefore, a refresh operation is necessary to reverse the shift of the threshold voltage distribution 438 (e.g., in a direction indicated by an arrow 436) back to the threshold voltage distribution 432.

Figure 5:
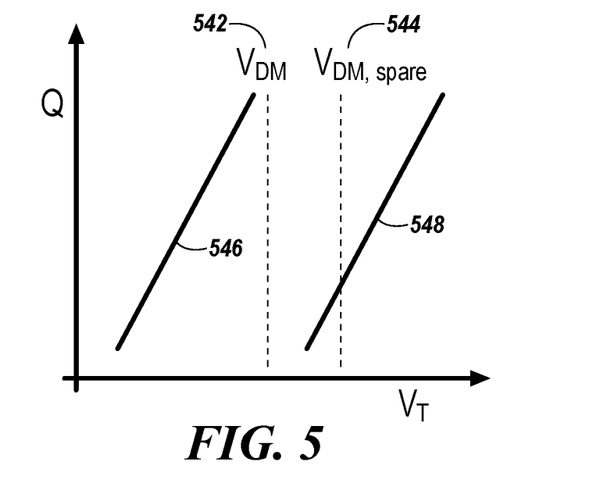
FIG. 5 illustrates a conceptual example of increasing a magnitude of a voltage pulse for sensing data states of spare memory cells, in accordance with an embodiment of the present disclosure.

FIG. 5 illustrates a conceptual example of increasing a magnitude of a voltage pulse for sensing data states of spare memory cells, in accordance with an embodiment of the present disclosure. For example, FIG. 5 illustrates an example demarcation voltage VDM, SPARE (e.g., voltage 544 illustrated in FIG. 5) for sensing data states of additional (e.g., spare) memory cells, in accordance with an embodiment of the present disclosure. A demarcation voltage VDM (e.g., voltage 542 illustrated in FIG. 5) can be, for instance, demarcation voltage VDM1 and/or VDM2 previously described in connection with FIG. 2A. For example, the VDM 542 illustrated in FIG. 5 can be used to distinguish cells in one state from cells in a different state. Although embodiments are not so limited, threshold voltage distributions 546 and 548 can correspond to the threshold voltage distributions 201-2 (e.g., state 1) and 202-2 (e.g., state 0), respectively and described in connection with FIG. 2A.

While the VDM 542 is used to sense non-spare memory cells (e.g., memory cells 652-1, . . . , 652-M illustrated in FIG. 6), spare memory cells (e.g., memory cells 654-1 and/or 654-N illustrated in FIG. 6) can be sensed using VDM, SPARE 544. Since the VDM, SPARE 544 has a greater magnitude than that of the VDM 542, sensing the spare memory cells using VDM, SPARE 544 will cause the spare memory cells to fail at an earlier point than sensing the non-spare memory cells using VDM 542. As such, a failure of the spare memory cells being sensed using the VDM, SPARE 544 can be an indicator of whether to refresh the non-spare memory cells. For example, refreshing the non-spare memory cells in response to the sensed data states of the spare memory cells being erroneous can readjust the threshold voltage distribution (e.g., the distribution 548) of the non-spare memory cells before the non-spare memory cells fail.

A refresh operation can be selectively performed on those memory cells originally programmed to a particular data state. For example, the threshold voltage distribution 548 can be shifted toward the threshold voltage distribution 546 (e.g., due to read disturb), which will result in a portion of those memory cells previously programmed to a data state (e.g., state 0) corresponding to the threshold voltage distribution 548 to be erroneously sensed to be in a data state (e.g., state 1) corresponding to the threshold voltage distribution 546. In contrast, shift of the threshold voltage distribution 546 (e.g., toward 0 V) may not impact the sensing those memory cells programmed to a data state corresponding to the threshold voltage distribution 546. Therefore, when needed, a refresh operation can be selectively performed only on those memory cells previously programmed to a data state corresponding to the threshold voltage distribution 548 rather than on those memory cells previously programmed to a data state corresponding to the threshold voltage distribution 546. Alternatively speaking, since memory cells programmed to a data state corresponding to the threshold voltage distribution 546 will experience a snapback event in response to the VDM 542 being applied, the refresh operation can be performed on those memory cells that did not experience a snapback event in response to the VDM 542 being applied.

In some examples, refreshing memory cells programmed to a data state corresponding to the threshold voltage distribution 548 can be performed by applying a voltage pulse (to the memory cells) having a magnitude greater than and a polarity opposite to that of VDM 542 or VDM, SPARE 544. For example, when a polarity of the VDM 542 and VDM, SPARE 544 is positive, a negative voltage pulse having a magnitude greater than threshold voltages of memory cells with the threshold voltage distribution 548 can be applied to refresh the cells.

Figure 6:
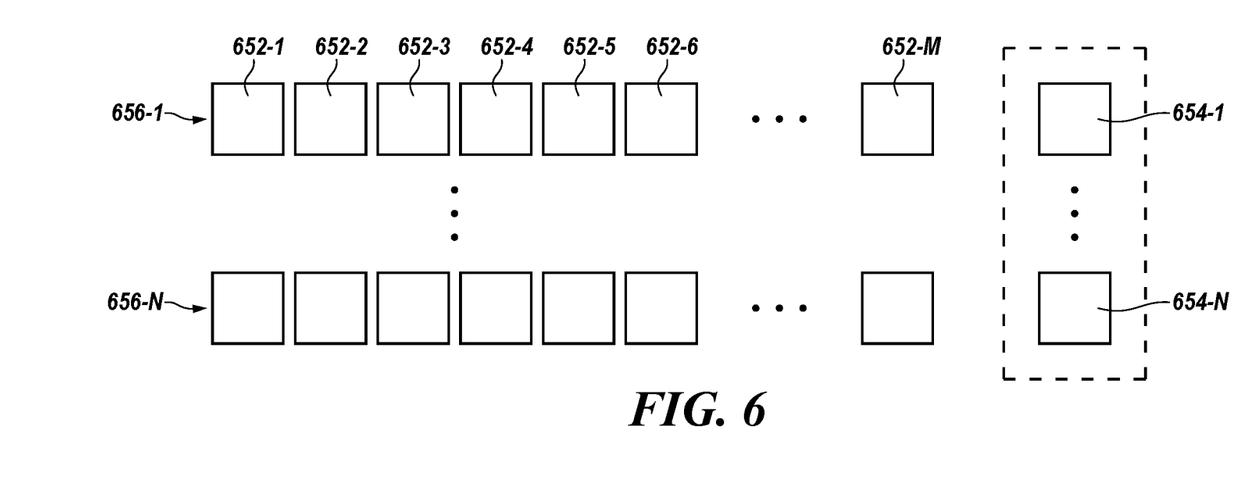
FIG. 6 illustrates example memory cells whose data states are indicative of whether to refresh other memory cells, in accordance with an embodiment of the present disclosure.

FIG. 6 illustrates example memory cells 654-1, . . . , 654-N (e.g., collectively referred to as memory cells 654) whose data states are indicative of whether to refresh other memory cells 652-1, . . . , 652-M (e.g., collectively referred to as memory cells 652), in accordance with an embodiment of the present disclosure. The memory cells 652 and/or 654 can be, for instance, memory cells 125 previously described in connection with FIG. 1.

Each group of memory cells 656-1, . . . , 656-N (e.g., collectively referred to as 656) each having memory cells 652-1, . . . , 652-M (e.g., collectively referred to as memory cells 652) can be referred to as a partition. Each partition can be associated with an additional (e.g., spare) memory cell whose data state is indicative of whether to refresh memory cells of a respective partition. For example, the partition 656-1 can be associated with an additional memory cell 654-1 (whose data state is indicative of whether to refresh memory cells 652 of the partition 656-1) and the partition 656-N can be associated with an additional memory cell 654-N (whose data state is indicative of whether to refresh memory cells 652 of the partition 656-N). Although a single additional memory cell is illustrated as being associated for each partition in FIG. 6, an embodiment is not limited to a particular quantity of additional memory cells each partition can be associated with. For example, each partition (e.g., partitions 656-1, . . . , 656-N) can be associated with more than one (e.g., three) additional memory cells. Further, partitions 656 can be associated with different quantities of additional memory cells. For example, a quantity of additional memory cells associated with one partition can be different than a quantity of additional memory cells associated with a different partition. Although embodiments are not so limited, a quantity of spare memory cells can be less than 1% of a quantity of non-spare memory cells associated with the quantity of spare memory cells. For instance, the ratio of non-spare to spare memory cells can be greater than 100 to 1.

Memory cells 652 of each partition 656 can be distributed over (e.g., respectively located in) different memory tiles. Further, spare memory cells can be located in a different tile than those tiles in which non-spare memory cells are located. Memory cells in different tiles can be accessed simultaneously. Alternatively speaking, non-spare memory cells 652 of each partition 656 as well as their associated spare memory cells 652 can be accessed simultaneously.

As described herein, a controller (e.g., the controller 304 illustrated in connection with FIG. 3) can apply voltage pulses having different magnitudes to memory cells 652 and 654, respectively. For example, the controller 304 can apply (to sense a data state of the memory cells 652) a first voltage pulse to the memory cells 652, and apply, while the first voltage pulse is applied to the memory cells 652, a second voltage pulse having a greater magnitude than the first voltage pulse to the memory cells 654 to sense a data state of the memory cells 654. The controller can apply the voltage pulses to memory cells 652 and 654, for instance, upon receiving a command (e.g., from a host) to sense the data states of memory cells 652.

In a non-limiting example, a memory (e.g., the memory array 306 illustrated in connection with FIG. 3) can have a group of memory cells (e.g., non-spare memory cells 652) and one or more additional (e.g., spare memory cells 654) whose data state is indicative of whether to refresh the group of memory cells. A controller (e.g., the controller 304 illustrated in connection with FIG. 3) can receive a command to sense respective data states of the memory cells of the group. Upon receiving the command, the controller can apply a first voltage pulse to the group of memory cells to sense the respective data states of the memory cells of the group and a second voltage pulse having a magnitude greater than the first voltage pulse to sense a data state of the one or more additional memory cells. The controller can perform a refresh operation on the group of memory cells in response to the sensed data state of the one or more additional memory cells being different from a predetermined data state.

Continuing with the non-limiting example, the refresh operation can be performed by applying a third voltage pulse to those memory cells of the memory cells 652 whose data state is sensed to be in the predetermined data state. The third voltage pulse can have a magnitude greater than the second voltage pulse and a polarity opposite to the first voltage pulse or the second voltage pulse.

In another non-limiting example, a controller (e.g., the controller 304 illustrated in connection with FIG. 3) can receive a command to sense respective data states of a group of memory cells of a memory. Upon receiving the command, the controller can sense the respective data states of the memory cells of the group by applying a first voltage pulse to the group of memory cells and sense a data state of one or more additional memory cells previously programmed to a first data state (e.g., reset state) in a particular polarity by applying a second voltage pulse having a magnitude greater than that of the first voltage pulse to the additional (e.g., spare) one or more memory cells. As described herein, a data state of the additional one or more memory cells can be indicative of whether to refresh the group of memory cells. In response to the sensed data state of the additional one or more memory cells being in a second data state (e.g., set state), the controller can perform a refresh operation on those memory cells of the group having a first data state in the particular polarity.

In an example, whether to perform a refresh operation can be determined based on a quantity of spare memory cells whose sensed data state is different than a predetermined data state (e.g., reset state). For example, a refresh operation can be performed on non-spare memory cells in response to a quantity of spare memory cells whose sensed data state is different from a predetermined data state meeting or exceeding a threshold quantity. Although embodiments are not so limited, a threshold quantity can be 20-30% of an entire quantity of spare memory cells. For example, if the spare memory cells associated with a partition of non-spare cells includes 100 spare memory cells, the non-spare memory cells can be refreshed when at least 20-30 out of 100 spare memory cells are determined to have failed.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
sensing respective data states of memory cells of a group of memory cells of a memory by applying a first voltage pulse to the group of memory cells, wherein the memory further comprises one or more additional memory cells whose data state is indicative whether to refresh the group of memory cells;
sensing, while the first voltage pulse is applied to the group of memory cells, a data state of the one or more additional memory cells by applying a second voltage pulse having a greater magnitude than the first voltage pulse to the one or more additional memory cells; and
applying, to perform a refresh operation on the group of memory cells, a third voltage pulse to those memory cells of the group whose data state is sensed to be in a particular data state in response to the sensed data state of the one or more additional memory cells being different from the particular data state.

2. The method of claim 1, wherein the third voltage pulse has a magnitude greater than the second voltage pulse and a polarity opposite to the first voltage pulse or the second voltage pulse.

3. The method of claim 1, further comprising preventing the refresh operation from being performed on the group of memory cells in response to the sensed data state of the one or more additional memory cells not being different from the particular data state.

4. The method of claim 1, wherein:
the group of memory cells is one of a plurality of groups of memory cells of the memory; and
each respective one of the plurality of groups of memory cells is associated with a different one or more additional memory cells whose data state is indicative of whether to refresh that group of memory cells.

5. The method of claim 4, wherein at least two groups of the plurality of groups of memory cells are associated with different quantities of one or more additional memory cells.

6. The method of claim 1, wherein the memory cells of the group of memory cells are located in different tiles of the memory.

7. The method of claim 6, wherein the one or more additional memory cells are located in a different memory tile than those the memory cells of the group of memory cells are located in.

8. The method of claim 1, wherein the particular data state is associated with an asymmetric threshold voltage distribution whose magnitude is greater for a positive polarity than a negative polarity.

9. The method of claim 1, wherein each memory cell of the group of memory cells is programmable to one of two data states including a first data state corresponding to the particular data state and a second data state associated with an asymmetric threshold voltage distribution whose magnitude is greater for a negative polarity than a positive polarity.

10. The method of claim 1, wherein a quantity of the memory cells of the group of memory cells is larger than a quantity of the one or more additional memory cells.

11. A method, comprising:
applying a first voltage pulse to a group of memory cells of a memory to sense a data state of memory cells of the group, wherein:
the memory cells of the group are distributed over a plurality of tiles of the memory; and
the memory further comprises one or more additional memory cells whose data state is indicative of whether to refresh the group of memory cells, wherein the one or more additional memory cells are located in an additional tile of the memory;
applying, while the first voltage pulse is applied to the group of memory cells, a second voltage pulse having a greater magnitude than the first voltage pulse to the one or more additional memory cells to sense a data state of the one or more additional memory cells; and
determining whether to perform a refresh operation on the group of memory cells based on the sensed data state of the one or more additional memory cells.

12. The method of claim 11, further comprising applying, to perform the refresh operation on the group of memory cells, a third voltage pulse having a magnitude greater than the second voltage pulse.

13. The method of claim 11, further comprising determining whether to perform the refresh operation on the group of memory cells based on a quantity of the one or more additional memory cells whose sensed data state is different than a predetermined data state.

14. The method of claim 13, further comprising performing the refresh operation on the group of memory cells in response to the quantity of the one or more additional memory cells meeting or exceeding a threshold quantity.

15. The method of claim 11, wherein the first and second voltage pulses have a same polarity.

16. A method, comprising:
applying, to sense respective data states of memory cells of a group of first memory cells of a memory, a first voltage pulse to the group of first memory cells, wherein the memory further comprises one or more second memory cells whose data state is indicative of whether to refresh the group of first memory cells;
applying, to sense a data state of one or more second memory cells, a second voltage pulse having a greater magnitude than the first voltage pulse to the one or more second memory cells, while the first voltage pulse is applied to the group of first memory cells; and
selectively refreshing, in response to the sensed data state of the one or more second memory cells being different from a particular data state to which the one or more second memory cells was previously programmed, those memory cells of the group that did not experience a snapback event in response to the first voltage pulse being applied.

17. The method of claim 16, further comprising selectively refreshing those memory cells of the group that did not experience a transition from a non-conductive state to a conductive state in response to the first voltage pulse being applied.

18. The method of claim 16, wherein:
the group of first memory cells is one of a plurality of groups of first memory cells respectively corresponding to a plurality of partitions; and
the one or more second memory cells are part of a plurality of second memory cells, wherein each one of the plurality of second memory cells is associated with a respective one of the plurality of partitions and indicative of whether to refresh a respective one of the plurality of partitions.

19. The method of claim 18, wherein a quantity of second memory cells associated with a first partition of the plurality of partitions is different than a quantity of second memory cells associated with a second partition of the plurality of partitions.

20. The method of claim 18, wherein:
the plurality of partitions are distributed over different memory tiles of a plurality of first memory tiles; and
the plurality of second memory cells are located in a second memory tile that is different from the plurality of first memory tiles.

\* \* \* \* \*